United States Patent [19]
Lee et al.

[11] Patent Number: 6,124,153
[45] Date of Patent: Sep. 26, 2000

[54] METHOD FOR MANUFACTURING A POLYSILICON TFT WITH A VARIABLE THICKNESS GATE OXIDE

[75] Inventors: Joo-hyung Lee, Seoul; Yong-suk Jin, Kyungki-do, both of Rep. of Korea

[73] Assignee: Samsung Electronics Co., Ltd., Kyungki-Do, Rep. of Korea

[21] Appl. No.: 08/680,062

[22] Filed: Jul. 15, 1996

[30] Foreign Application Priority Data

Jul. 14, 1995 [KR] Rep. of Korea ................ 95/20786

[51] Int. Cl.⁷ .................................................. H01L 21/84
[52] U.S. Cl. ..................... 438/151; 438/165; 438/591; 438/981; 148/DIG. 43; 148/DIG. 163
[58] Field of Search .................. 437/21, 40 GS, 437/40 TFT, 41 GS, 41 TFT, 42, 238, 239, 978, 979; 148/DIG. 43, DIG. 163; 438/151, 165, 591, 770, 981

[56] References Cited

U.S. PATENT DOCUMENTS

| | | |
|---|---|---|
| 4,920,393 | 4/1990 | Kawakami . |
| 5,382,533 | 1/1995 | Ahmad et al. ................ 437/242 |
| 5,581,102 | 12/1996 | Kusomoto ................ 257/347 |
| 5,602,410 | 2/1997 | Schwalke et al. .............. 257/401 |

FOREIGN PATENT DOCUMENTS

| | | |
|---|---|---|
| 63-177561 | 7/1988 | Japan . |
| 63-308962 | 12/1988 | Japan . |
| 4-102375 | 4/1992 | Japan . |
| 4-264862 | 9/1992 | Japan . |
| 5-67776 | 3/1993 | Japan . |

OTHER PUBLICATIONS

H.–H. Tseng et al., IEEE Trans. Electron Dev. 49(3)(Mar. 1993)613 "A comparison of CVD stacked gate oxide. . . ".
S. Wolf, "Silicon Processing for the VLSI Era", vol. III, pp. 226–29, 317, 502–05, 518–20, 601–03, 664, 1995.
H.–H. Tseng et al., IEDM '93 Proc., p. 321 "Thin CVD stacked gate dielectric. . . ".
H.–H. Tseng et al., IEDM '91 Proc., p. 75 "Advtantages of CVD stacked gate oxide . . . ".
Y. Pan, IEEE Trans. Electron Dev. 41(2)(Feb. 1994)268 "An experimental study of the Fowler–Nordheim . . . ".
Y. Pan et al., Solid State Electronics 37(1)(Jan. 1994)77 "Comparison of gate–edge effects on hot–carrier . . . ".
R. Moazzami et al., IEEE Electron Dev. Lett. 14(2)(Feb. 1993)72 "A high quality stacked thermal/LPCVD gate oxide . . . ".
R. Moazzami et al., 1991 Int'l Symp. on VLSI Technol. Syst. & Appl. (VLSITSA), p. 52 "A high quality stacked thermal/LPCVD gate oxide . . . ".

*Primary Examiner*—Charles L. Bowers, Jr.
*Assistant Examiner*—Leon Radomsky
*Attorney, Agent, or Firm*—Pillsbury Madison & Sutro LLP

[57] ABSTRACT

A method for manufacturing a polysilicon thin film transistor (TFT) according to the present invention reduces the electric field near the drain junction by varying partially the thickness of a gate insulating layer through a post oxide process. A polysilicon layer is patterned to become an active layer and a chemical vapor deposition oxide film deposited. By thermal oxidation a thermal oxide film is formed under the chemical vapor deposition oxide film. A gate electrode made of polysilicon is formed on the gate insulating layer. Thermal oxidation is performed to make the end portions of the thermal oxide film thicker than the portion under the gate electrode of the thermal oxide film. With this process, the electric field near the drain junction region is reduced and thus the leakage currents of the TFT decrease. In addition, the method in this invention is very simple compared with the conventional methods of obtaining a LDD structure and on-current is not reduced.

26 Claims, 3 Drawing Sheets

METHOD FOR MANUFACTURING A POLYSILICON TFT WITH A VARIABLE THICKNESS GATE OXIDE

BACKGROUND OF THE INVENTION

1. Field of the Invention

The present invention relates to a polysilicon thin film transistor (herein after referred to as a TFT) and a method for manufacturing the same, and, more particularly, to a method for manufacturing a polysilicon TFT of which reduces the electric field near the drain junction is reduced by varying the thickness of a gate insulating layer through a post oxidation process.

2. Description of the Related Art

TFTs are mainly used as switching elements of pixels in a liquid crystal display (herein after referred to as an LCD) and are classified into two types based on the material used as an active layer of the TFT. One type used amorphous silicon as the active layer of the TFT. One type uses amorphous silicon as the active layer, while the other type uses polysilicon. Since LCDs with the amorphous silicon TFTs are light and thin, and have low power consumption and good image quality as well, they are used in various portable electronic devices such as the notebook computers. Since the amorphous silicon TFT can be fabricated at a temperature below 600° C. which is the strain point of glass, it is possible to use glass as a substrate of an LCD panel. And since price of the glass is lower than that of the quartz, both of which are used as substrates of LCDs, the cost can, therefore, be lower. However, since the device characteristics of an amorphous silicon TFT is inferior to that of a polysilicon TFT, an amorphous TFT cannot be applied to circuits requiring high operation speed.

Since the polysilicon TFT has a carrier mobility higher than that of the amorphous silicon TFT, polysilicon TFT driving circuits can be integrated on the LCD panel. Further, the polysilicon TFT LCD does not require optical shielding, which is inevitable in the amorphous silicon TFT LCD due to the photo leakage current of the amorphous silicon. Also, the polysilicon TFT is suitable for the LCDs with large size and high density, particularly, since it is possible to form the driving circuits on the panel, the size of polysilicon TFT LCD can be miniaturized.

Polysilicon has small single-crystalline regions called grains. The silicon atoms in the interior of the grain are arranged periodically, as in a single crystalline silicon, but the atoms around the boundaries of the grains are arranged in a non-periodic fashion, resulting in incomplete bondings and thus many defects. Since the interior of the grain has a perfect crystalline structure, the polysilicon has mobility superior to the amorphous silicon, which has no crystalline structure. However, the polysilicon has narrow energy gaps, and a lot of dangling bonds exist in the grain boundaries. These defects, located in the center of the energy band gap, contribute to the creations of the carriers and serve as the center of the recombinations of the carriers. Consequently, there is a problem that leakage currents are produced, particularly near the drain junction which is under a high electric field.

A conventional polysilicon TFT will now be described in detail with reference to FIG. 1, which shows a cross sectional view of a top gate type conventional polysilicon TFT in which a gate electrode lies on over an insulator that is on an active layer.

An active layer 12 made of polysilicon is formed on a transparent glass substrate 11, and a gate insulating layer 13 made of silicon oxide is formed thereon. A gate electrode 14 is formed on the gate insulating layer 13 and is covered with an insulating film 15. Both the gate insulating layer 13 and the insulating film 15 have two contact holes through which a source and a drain electrodes 16 and 17, respectively, are contacted with the active layer 12.

The polysilicon TFT of this structure has a disadvantage in that leakage currents are larger than those of the amorphous silicon TFT. The leakage currents are generated by the tunneling of the carriers under the strong electric field around the junction of a drain region and a channel region (hereinafter referred to as a drain junction) in the active layer. The on-current probability of tunneling is determined by the density of the traps in the polysilicon. Since the polysilicon has lots of traps, the leakage currents are large. In order to reduce these leakage currents, methods for lowering the electric fields near the drain junction are generally used. One of the latter methods is to adopt a lightly-doped drain (hereinafter referred to as an LDD) structure.

An LDD structure is formed by using sidewalls or a photoresist layer as masks for implanting LDD ions. For the sake of reducing the leakage currents effectively, the length of the LDD region would ideally be about 1–2 μm, but it is very difficult to make the LDD with such a small length when using sidewalls as a mask. It is also difficult to obtain a reproducible LDD structure when using a photoresist since the self-alignment is not possible in the photolithography. Moreover, there is a problem in the LDD structure that on-current is reduced suddenly.

SUMMARY OF THE INVENTION

An object of the invention is to reduce the leakage currents without reducing on-current by decreasing the strength of the electric field near the drain junction.

A method for manufacturing a polysilicon TFT according to the present invention comprises the following steps.

First, polysilicon layer that serves as an active layer is formed on a transparent insulating substrate, and gate insulating layer made of silicon oxide is formed on the polysilicon layer. The gate insulating layer may be a single film made by thermal oxidation of the polysilicon layer or made by a CVD (chemical vapor deposition) method, or a double film comprised of a CVD oxide film deposited by a CVD method and a thermal oxide film under the CVD oxide film made by thermal oxidation of the polysilicon layer. The gate electrode made of a conductive material such as polysilicon is formed on the gate insulating layer. Thermal oxidation is thereafter performed to make end portions of the gate insulating layer thicker than a portion of the gate insulating layer under the gate electrode.

When the gate insulating layer is the double film of a CVD oxide film and thermal oxide film, it is preferable that the thickness of the CVD oxide film is less than 500 Å and the thickness of the thermal oxide film is less than 500 Å, preferably less than 200 Å.

Preferably, the gate electrode is made of polysilicon and then the gate electrode is oxidized in part. The thickness of the oxidized portions of the gate electrode is, preferably, 500–2,000 Å.

It is preferable that the difference in thickness between the portion under the gate electrode and the end portions of the gate insulating layer is 300–350 Å.

A polysilicon TFT according to the present invention includes a gate insulating layer formed between a polysilicon layer serving as an active layer and a gate electrode, and the portion, under the gate electrode, of the gate insulating layer is thinner than the remaining portions of the gate insulating layer.

BRIEF DESCRIPTION OF THE DRAWINGS

The present invention will become more fully understood from the detailed description provided below, and scope of applicability of the present invention will become apparent. However, it should be understood that the detailed description and specific examples, while indicating preferred embodiments of the invention, are given by way of illustration only, since various changes and modifications within the spirit and scope of the invention will become apparent to those skilled in the art from this detailed description. Thus, the accompanying drawings which are given by way of illustration only, and thus are not limitative of the present invention and wherein.

DETAILED DESCRIPTION OF THE PREFERRED EMBODIMENT

An embodiment according to this invention will now be described in detail with the reference to the accompanying drawings in following.

Figure 2A:
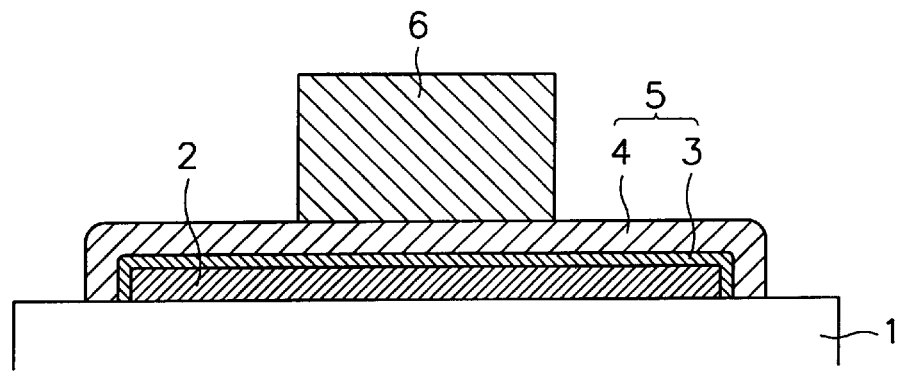
FIG. 2A–2C are cross sectional views showing the method for manufacturing a polysilicon TFT according to the embodiment of the present invention.
Figure 2B:
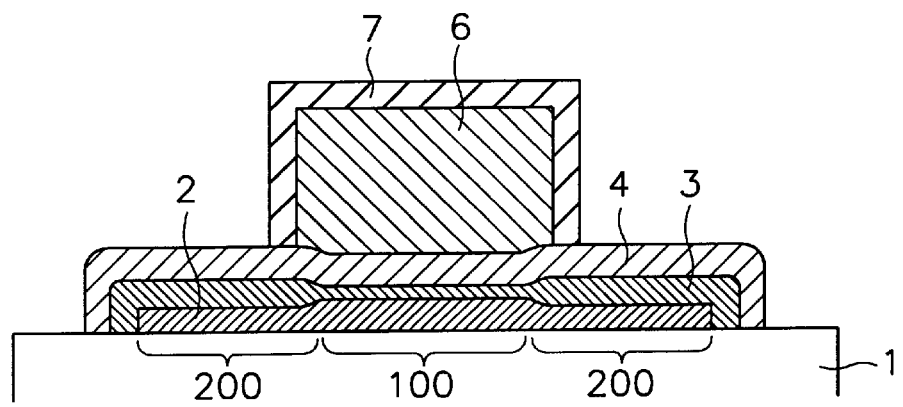
Figure 2C:
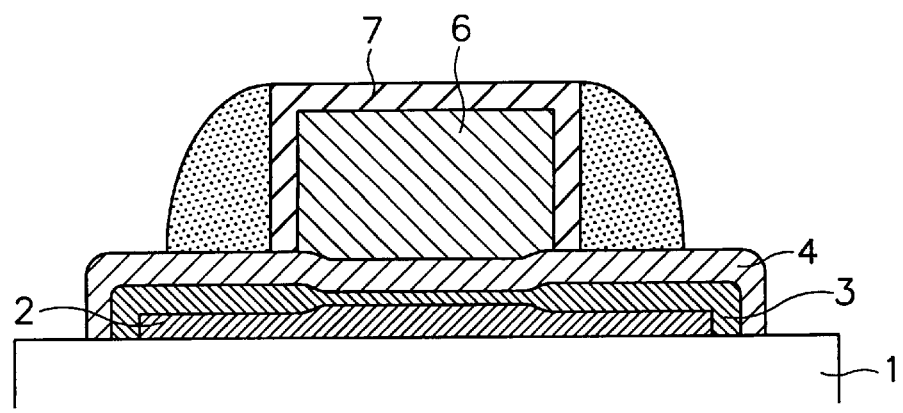

FIG. 2A–2C are cross sectional views showing the method for manufacturing a polysilicon TFT according to the embodiment of the present invention.

First, an active layer 2 made of the polysilicon is formed on a transparent insulating substrate 1 of such as glass or quartz, with thickness of a 500 Å. The active layer 2 is formed by depositing polysilicon directly on substrate 1 or by depositing and converting an amorphous silicon into a polysilicon using heat treatment. Then, a CVD oxide film 4 is deposited about 200–1,000 Å, in thickness, with the plasma enhance chemical vapor deposition (PECVD)|, the atmospheric chemical vapor deposition (APCVD) or the low pressure chemical vapor deposition (LPCVD) etc. The thermal oxidation is performed to form a first thermal oxide film 3 with thickness of preferably less than 200 Å under the CVD oxide film 4. The double film comprised of the thermal oxide film 3 and the CVD oxide film 4 is a gate insulating layer 5. It is feasible to make the gate insulating layer 5 to be a double film in order to improve its characteristics. It is desirable, however, that the gate insulating layer 5 be a double film in order to improve its characteristics. Then, as shown in FIG. 2A, the gate electrode 6 is formed by depositing a electrically conductive material such as a polysilicon with thickness of about 3,000 Å and patterning it.

Next, post thermal oxidation under 850–950° C. is performed to form a second thermal oxide film 7 with a thickness of 500–2,000 Å, preferably about 700 Å, on the surface of the gate electrode 6 of the polysilicon. During this process, the active layer 2 is also oxidized. A channel region 100, which is the portion of the active layer 2 located under the gate electrode 6, is barely oxidized while the source/drain region 200, which are the portions of the active layer 2 located at both ends of the channel region 100, are mainly oxidized. Therefore, as shown in FIG. 2B, the portions of the first thermal oxide film 3 on the source/drain region 200 become thicker by 300–350 Å than the portion of the first thermal oxide film 3 on the channel region 100. The thickness of the source/drain region 200 decreases, and the increased thickness of the portions of the first thermal oxide film 3 is twice the decreased thickness of the source/drain region 200. Therefore, both end portions of the first thermal oxide film 3 expand upwards, and thus the end portions of the CVD oxide film 4 of the gate electrode 6 are lifted up. Consequently, since the end portions of the first thermal oxide film 3 become thicker than the portion of the first thermal oxide film 3 under the gate electrode 6, the electric field of the drain junction region decreases so as to reduce the leakage currents.

Then, ion implantation into the source/drain region is performed. Thus, the source/drain region with high concentration and the LDD region with low concentration are formed. Thereafter, ion implantation of the driving circuits is performed. Thereafter, polysilicon is deposited with thickness of 5,000–10,000 Å, preferably about 7,000 Å. The deposited polysilicon is then etched by reactive ion etching method to form sidewalls 8 on the sides of the second thermal oxide film 7. Finally, the polysilicon TFT in accordance with the present invention is completed by implanting ions into pixels.

Figure 1:
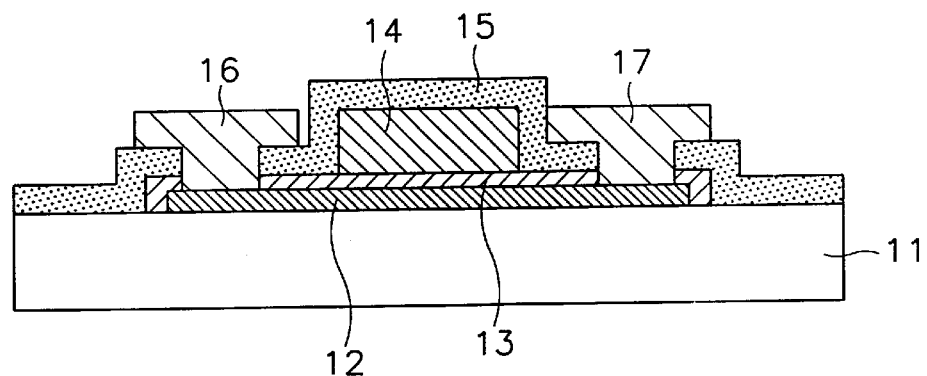
FIG. 1 is a cross sectional view of a conventional polysilicon TFT.
Figure 3:
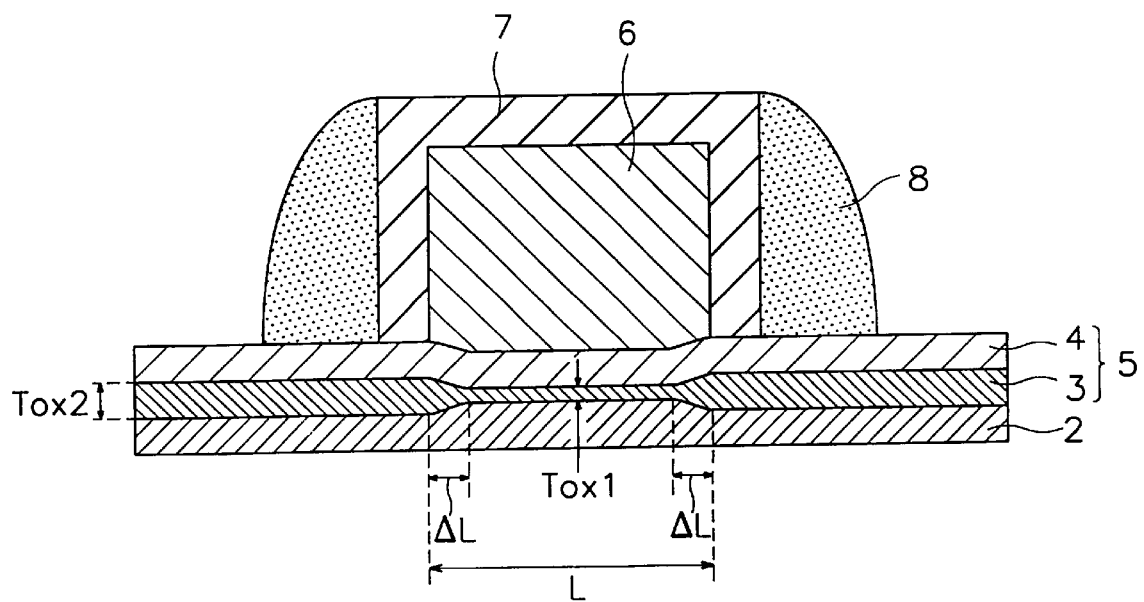
FIG. 3 is a cross sectional view of the polysilicon TFT according to the embodiment of the present invention.

FIG. 3 is a cross sectional view of the completed polysilicon TFT according to the embodiment of the present invention.

As shown in FIG. 3, an active layer 2 is formed on a transparent insulating substrate 1 and a gate insulating layer 5 comprised of a first thermal oxide film 3 and a CVD oxide film 4 is formed thereon. A gate electrode 6 is formed on the gate insulating layer 5 and the surfaces of the gate electrode 6 is covered with a second thermal oxide film 7. The end portions of the first thermal oxide film 3 are thicker than the portion under the gate electrode 6.

Let L be the width of the gate electrode 6, $\Delta L$ be the width of portions of the first thermal oxide film 3 which have the varying thickness, $T_{ox1}$ be the thickness of the thin portion of the first thermal oxide film 3, and $T_{ox2}$ be the thickness of the thick portions of the first thermal oxide film 3. Since $\Delta L$ is negligible compared with L, the threshold voltage Vth is inversely proportional to, $$T_{ox1} X(L - 2\Delta L)/L + T_{ox2} X 2\Delta L/L = T_{ox1} + (T_{ox2} - T_{ox1}) X 2\Delta L/L$$

$$= T_{ox1}.$$

The on-current is hardly reduced. Since, however, the leakage current is related to the strength of the electric field in the drain junction region, the electric field of the drain junction is reduced because of the thick first thermal oxide film 1, in this structure according to the embodiment of the present invention. As a result, the leakage current is reduced.

Figure 4:
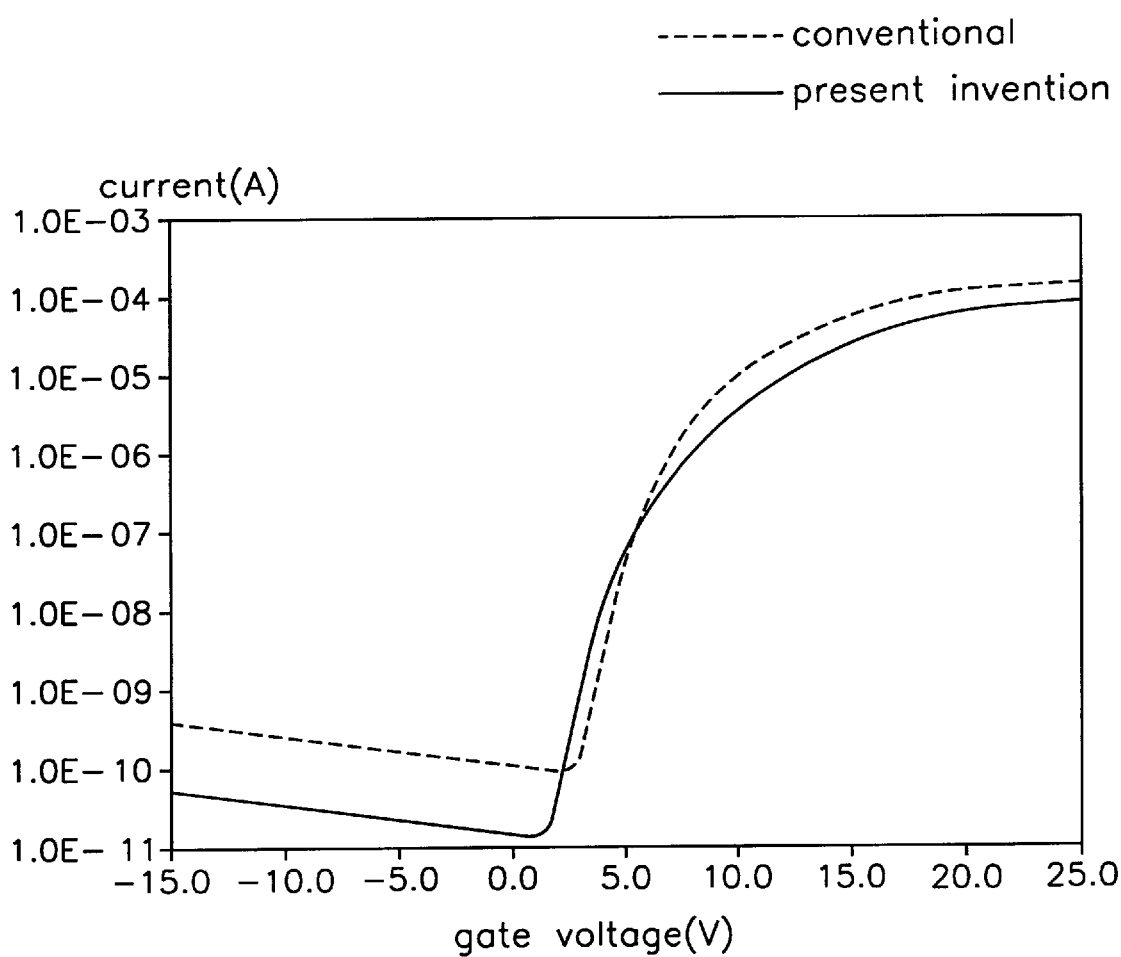
FIG. 4 is a graph showing the characteristics of the polysilicon TFT according to the detailed embodiment of the present invention.

FIG. 4 is a graph showing characteristics of the polysilicon TFT made by above-mentioned method and that of a conventional polysilicon TFT. The horizontal axis represents the gate voltage applied to the gate electrode 6 of the TFT and the vertical axis represents the current between the source/drain regions 200. The current according to the above mentioned embodiment is represented as a solid line and the current according to the conventional art is represented as a solid line and the current according to the conventional art is represented as a dotted line. As shown in FIG. 4, the on-current of the polysilicon TFT according to this invention is similar to that of the conventional art.

As mentioned above, in this invention, the electric field of the drain junction region is lowered by varying the thickness of the gate insulating layer through the post oxidation process so as to reduce the leakage current of the TFT. In addition, there are advantages that the process of this invention is very simple compared with the conventional LDD process and that the on-current is not reduced. Particularly, if the process according to the present invention is executed along with a conventional process for manufacturing the LDD structure using the sidewalls, it is possible to obtain the LDD length of 1–2 $\mu$m using the sidewalls with thickness of 7,000 Å.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a polysilicon thin film transistor, comprising the steps of:
    forming a polysilicon layer on a transparent insulating substrate;
    forming a silicon oxide layer on the polysilicon layer, wherein said silicon oxide layer is a double film;
    forming a gate electrode over a part of the silicon oxide layer;
    performing thermal oxidation so that end portions of the silicon oxide layer which exist on opposite sides of said gate electrode are thicker than a portion of the silicon oxide layer under the gate electrode; and
    forming source and drain contacts in said end portions of the silicon oxide layer.

2. The method for manufacturing the polysilicon thin film transistor according to claim 1, wherein the silicon oxide layer is formed by thermal oxidation of the polysilicon layer.

3. The method for manufacturing the polysilicon thin film transistor according to claim 2, wherein the step of forming a silicon oxide layer comprises the substeps of:
    forming a chemical vapor deposition oxide film using a chemical vapor deposition method on the polysilicon layer; and
    performing thermal oxidation to form a thermal oxide film under the chemical vapor deposition oxide film.

4. The method for manufacturing the polysilicon thin film transistor according to claim 3, wherein the thickness of the chemical vapor deposition oxide film is 200–1,000 Å.

5. The method for manufacturing the polysilicon thin film transistor according to claim 4, wherein the thickness of the thermal oxide film is less than 200 Å.

6. The method for manufacturing the polysilicon thin film transistor according to claim 1, wherein the gate electrode is made of polysilicon, and wherein the step of performing thermal oxidation the gate electrode is also oxidized in part and the thickness of the oxidized portion of the gate electrode is 500–2,000 Å.

7. The method for manufacturing the polysilicon thin film transistor according to claim 6, wherein the difference in thickness between the portion of the polysilicon layer under the gate electrode and the end portions of the active layer is 300–350 Å.

8. The method for manufacturing the polysilicon thin film transistor according to claim 1, further comprising the step of implanting ions into the polysilicon layer to form a source/drain region with high concentration and a lightly-doped drain region with low concentration.

9. The method for manufacturing the polysilicon thin film transistor according to claim 8, further comprising the step of forming sidewalls on the oxidized portion of the gate electrode.

10. The method for manufacturing the polysilicon thin film transistor according to claim 9, wherein the thickness of the sidewalls is 5,000–10,000 Å.

11. A method for manufacturing the polysilicon thin film transistor, comprising the steps of:
    forming a polysilicon layer on a transparent insulating substrate;
    forming a chemical vapor deposition oxide layer on the polysilicon layer;
    performing pre-thermal oxidation to form a thermal oxide layer under the chemical vapor deposition oxide layer;
    forming a gate electrode on the chemical vapor deposition oxide layer;
    performing post-thermal oxidation so that a first portion of the thermal oxide layer which exist under both sides of the gate electrode are thicker than a second portion of the thermal oxide layer; and
    forming a source and a drain regions by ion implantation.

12. The method for manufacturing the polysilicon thin film transistor according to claim 11, wherein the thickness of the chemical vapor deposition oxide layer formed in the step of forming the chemical vapor deposition oxide layer is 200–1,000 Å.

13. The method for manufacturing the polysilicon thin film transistor according to claim 12, wherein the thickness of the thermal oxide layer formed in the step of performing pre-thermal oxidation is less than 200 Å.

14. The method for manufacturing the polysilicon thin film transistor according to claim 11, wherein the gate electrode is made of polysilicon, and wherein during the step of performing post-thermal oxidation the gate electrode is also oxidized in part and the thickness of the oxidized portion of the gate electrode is 500–2,000 Å.

15. The method for manufacturing the polysilicon thin film transistor according to claim 11, wherein a first portion of the polysilicon layer under the second portion of the thermal oxide layer is thinner than a second portion of the polysilicon layer under the first portion of the thermal oxide layer during the step of performing thermal oxidation.

16. The method for manufacturing the polysilicon thin film transistor according to claim 15, wherein the difference in the thickness between the first and the second portion of the polysilicon layer is 300–350 Å.

17. The method for manufacturing the polysilicon thin film transistor according to claim 11, further comprising the step of implanting ions into the polysilicon layer to form a lightly-doped drain region.

18. The method for manufacturing the polysilicon thin film transistor according to claim 17, further comprising the step of forming sidewalls on the oxidized portion of the gate electrode.

19. The method for manufacturing the polysilicon thin film transistor according to claim 18, wherein the thickness of the sidewalls is 5,000–10,000 Å.

20. A method for manufacturing the polysilicon thin film transistor, comprising the steps of:
    forming a polysilicon layer on a transparent insulating substrate;
    forming a first silicon oxide film on the polysilicon layer using a chemical vapor deposition method;

forming a second silicon oxide film between the first silicon oxide film and the polysilicon layer by performing thermal oxidation;

forming a gate electrode on a portion of the first silicon oxide film which lies on the second silicon oxide film; and performing thermal oxidation so that a first portion of the polysilicon layer under the gate electrode are thicker than a remaining second portion of the polysilicon layer.

21. The method of manufacturing the polysilicon thin film transistor according to claim 20, further comprising the step of forming source and drain contacts in the first and the second silicon oxide films.

22. The method for manufacturing the polysilicon thin film transistor according to claim 20, wherein the thickness of the first silicon oxide film formed in the step of forming the first silicon oxide film is 200–1,000 Å.

23. The method for manufacturing the polysilicon thin film transistor according to claim 22, wherein the thickness of the second silicon oxide film formed in the step of forming the second silicon oxide film is 200 Å.

24. The method for manufacturing the polysilicon thin film transistor according to claim 20, wherein the gate electrode is made of polysilicon, and wherein during the step of performing thermal oxidation the gate electrode is also oxidized in part and the thickness of the oxidized portion of the gate electrode is 500–2,000 Å.

25. The method for manufacturing the polysilicon thin film transistor according to claim 20, wherein the thickness between the first portion of the polysilicon layer an the second portion of the polysilicon layer is 300–350 Å.

26. The method for manufacturing the polysilicon thin film transistor according to claim 20, wherein a portion of the second silicon oxide film on the second portion of the polysilicon layer is thicker than a portion of the second oxide film on the first portion of the polysilicon layer.

* * * * *